(12) United States Patent
Choi et al.

(10) Patent No.: US 10,254,866 B2
(45) Date of Patent: Apr. 9, 2019

(54) DISPLAY DEVICE

(71) Applicant: SAMSUNG DISPLAY CO., LTD., Yongin-si, Gyeonggi-do (KR)

(72) Inventors: Byeong-Hwa Choi, Seoul (KR); Seung-Bae Lee, Seoul (KR)

(73) Assignee: Samsung Display Co., Ltd., Yongin-Si, Gyeonggi-do (KR)

(\*) Notice: Subject to any disclaimer, the term of this patent is extended or adjusted under 35 U.S.C. 154(b) by 326 days.

(21) Appl. No.: 15/170,963

(22) Filed: Jun. 2, 2016

(65) Prior Publication Data
US 2017/0153732 A1    Jun. 1, 2017

(30) Foreign Application Priority Data

Nov. 27, 2015    (KR) .................. 10-2015-0167461

(51) Int. Cl.
*G06F 3/041* (2006.01)
*G02B 5/30* (2006.01)
*H01L 27/12* (2006.01)

(52) U.S. Cl.
CPC .......... *G06F 3/0412* (2013.01); *G02B 5/3025* (2013.01); *G02B 5/3083* (2013.01); *G06F 3/041* (2013.01); *H01L 27/1248* (2013.01); *G06F 2203/04102* (2013.01)

(58) Field of Classification Search
CPC ....... B82Y 10/00; B82Y 25/00; G06F 3/0412; G06F 2203/04102; G06F 3/041; H01L 27/1248; G02F 1/09; G02F 2202/36
See application file for complete search history.

(56) References Cited

U.S. PATENT DOCUMENTS

| | | | | |
|---|---|---|---|---|
| 2003/0194839 A1* | 10/2003 | Chung | ............. | H01L 29/66772 438/151 |
| 2009/0052007 A1* | 2/2009 | Lee | ........................ | G02F 1/091 359/283 |
| 2011/0285661 A1* | 11/2011 | Hotelling | ............. | G06F 3/0418 345/174 |
| 2012/0169642 A1* | 7/2012 | Lee | ........................ | G06F 1/182 345/173 |
| 2014/0176883 A1* | 6/2014 | Zuo | ........................ | G02F 1/1333 349/106 |
| 2015/0035001 A1* | 2/2015 | Yamazaki | ........... | H01L 51/5253 257/100 |
| 2015/0131237 A1 | 5/2015 | Chen et al. | | |
| 2015/0346544 A1* | 12/2015 | Wu | ....................... | H05K 1/0274 349/110 |
| 2016/0062520 A1* | 3/2016 | Choi | .................. | H01L 27/3248 345/174 |
| 2016/0144401 A1* | 5/2016 | Carter | ................. | H01L 51/0012 428/179 |
| 2017/0115792 A1* | 4/2017 | Nishimura | ............ | G06F 3/0414 |

OTHER PUBLICATIONS

Hu, et al., "Transparent Half Metallic g-$C_4N_3$ Nanotubes: Potential Multifunctional Applications for Spintronics and Optical Devices" Scientific Reports 4, Article No. 6059 (2014).

\* cited by examiner

*Primary Examiner* — Gerald Johnson
(74) *Attorney, Agent, or Firm* — Lee & Morse, P.C.

(57) ABSTRACT

A display device, including a first transparent magnetic layer; a display panel on the first transparent magnetic layer; an upper member on the display panel; and a second transparent magnetic layer on the upper member, the second transparent magnetic layer being penetrated by light.

20 Claims, 12 Drawing Sheets

DISPLAY DEVICE

CROSS-REFERENCE TO RELATED APPLICATION

Korean Patent Application No. 10-2015-0167461, filed on Nov. 27, 2015, in the Korean Intellectual Property Office, and entitled: "Display Device," is incorporated by reference herein in its entirety.

BACKGROUND

1. Field

Example embodiments relate to display devices.

2. Description of the Related Art

A flat panel display (FPD) device may be lightweight and thin compared to a cathode-ray tube (CRT) display device, and a FPD device may be used as a display device of an electronic device. Examples of FPD devices include a liquid crystal display (LCD) device and an organic light emitting display (OLED) device.

SUMMARY

Embodiments may be realized by providing a display device, including a first transparent magnetic layer; a display panel on the first transparent magnetic layer; an upper member on the display panel; and a second transparent magnetic layer on the upper member, the second transparent magnetic layer being penetrated by light.

An attractive force may be applied between the first transparent magnetic layer and the second transparent magnetic layer.

The display panel and the upper member that are between the first and second transparent magnetic layers may be fixed between the first and second transparent magnetic layers through the attractive force.

The first transparent magnetic layer and the second transparent magnetic layer may include same materials.

The materials may have a nanotube structure of one-dimensional carbon nitride having a cylindrical shape.

The upper member may include a polarizer and a touch screen panel.

The polarizer may be on the display panel, and the touch screen panel may be on the polarizer.

The display device may further include a third transparent magnetic layer between the display panel and the polarizer.

An attractive force may be applied between the first transparent magnetic layer and the third transparent magnetic layer, and may be applied between third transparent magnetic layer and the second transparent magnetic layer, and an attractive force may be applied between the first transparent magnetic layer and the second transparent magnetic layer.

The display panel, the polarizer, and the touch screen panel that are between the first, second, and third transparent magnetic layers may be fixed between the first, second, and third transparent magnetic layers through the attractive force.

The display device may further include a fourth transparent magnetic layer between the polarizer and the touch screen panel.

An attractive force may be applied between the first, second, third, and fourth transparent magnetic layers to each other, and the display panel, the polarizer, and the touch screen panel that are between the first, second, third, and fourth transparent magnetic layers may be fixed between the first, second, third, and fourth transparent magnetic layers through the attractive force.

The first, second, third, and fourth transparent magnetic layers may include same materials, and the materials may have a nanotube structure of one-dimensional carbon nitride having a cylindrical shape.

The display panel may include a substrate; a display structure on the substrate; and a thin film encapsulation structure on the display structure.

The display structure may include a lower electrode on the substrate; a light emitting layer on the lower electrode, the light emitting layer emitting a light; and an upper electrode on the light emitting layer.

The second transparent magnetic layer may have a mesh structure including a plurality of openings, and the light emitted from the light emitting layer may travel through the openings.

The display panel may further include a semiconductor element between the substrate and the display structure.

The semiconductor element may include an active layer on the substrate; a gate electrode on the active layer; and source and drain electrodes on the gate electrode.

The display device may further include a gate insulation layer on the substrate, the gate insulation layer covering the active layer; an insulating interlayer on the gate insulation layer, the insulating interlayer covering the gate electrode; a planarization layer on the insulating interlayer, the planarization layer covering the source and drain electrodes; and a pixel defining layer on the planarization layer, the pixel defining layer exposing a portion of the lower electrode.

The thin film encapsulation structure may include a first encapsulation layer on the upper electrode, the first encapsulation layer including inorganic materials; a second encapsulation layer on the first encapsulation layer, the second encapsulation layer including organic materials; and a third encapsulation layer on the second encapsulation layer, the third encapsulation layer including inorganic materials.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
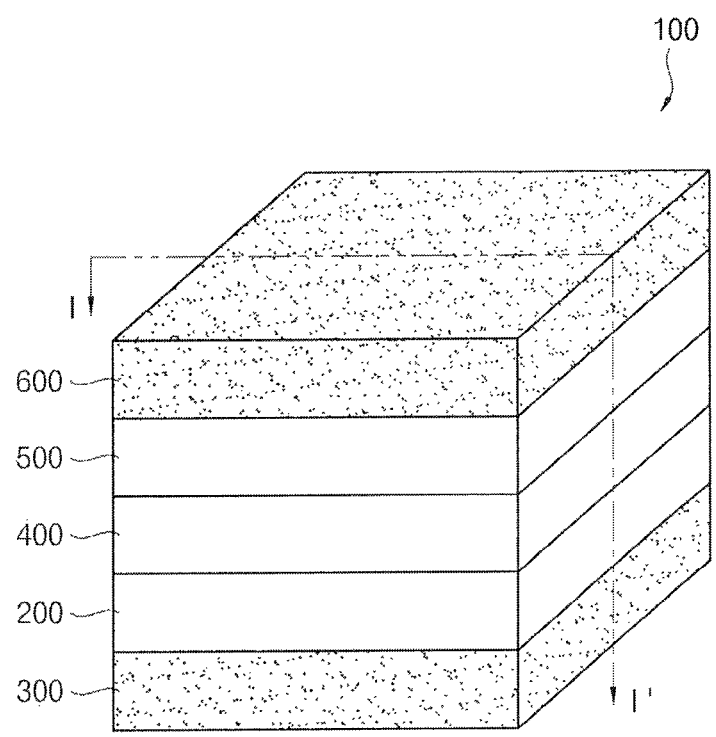
FIG. 1 illustrates a perspective view of a display device in accordance with example embodiments.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
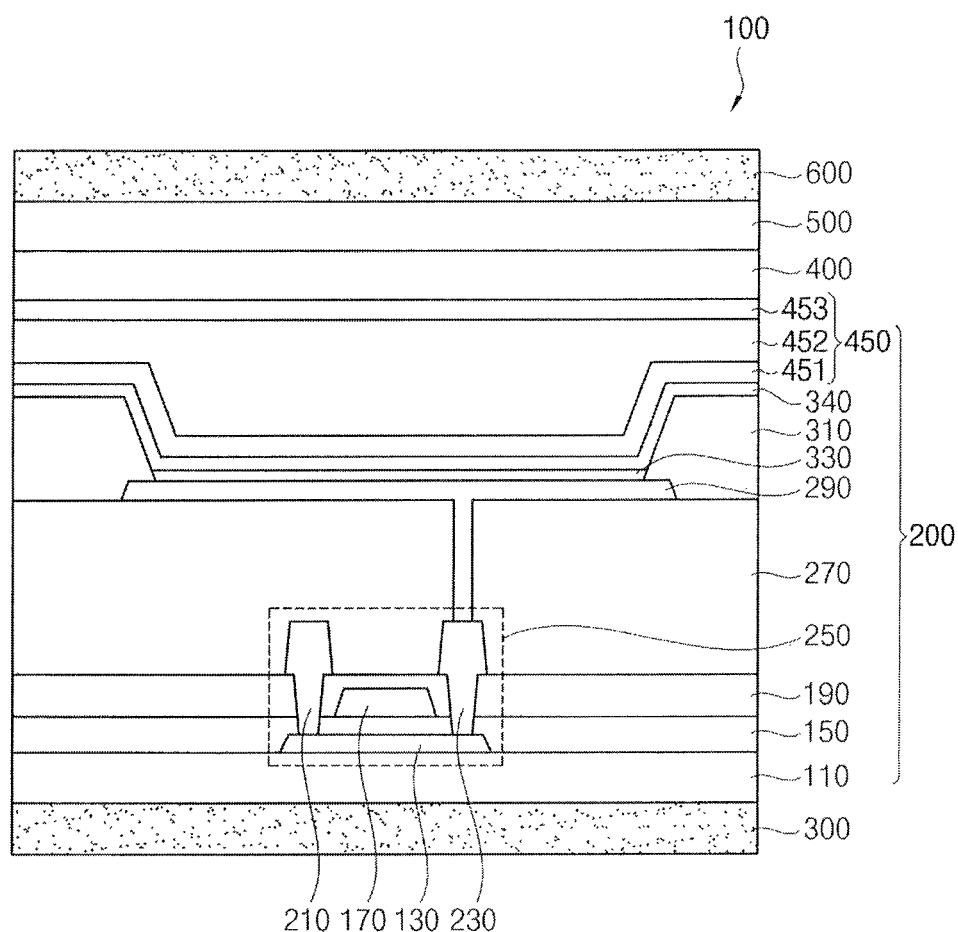
FIG. 2 illustrates a cross-sectional view taken along a line I-I' of FIG. 1.

FIG. 1 illustrates a perspective view of a display device in accordance with example embodiments, and FIG. 2 is a cross-sectional view taken along a line I-I' of FIG. 1.

Referring to FIGS. 1 and 2, a display device 100 may include a first transparent magnetic layer 300, a display panel 200, an upper member, and a second transparent magnetic layer 600. The display panel 200 may include, for example, a substrate 110, a semiconductor element 250, a gate insulation layer 150, an insulating interlayer 190, a planarization layer 270, a pixel defining layer 310, a display structure, and a thin film encapsulation structure 450. The upper member may include a polarizer 400 and a touch screen panel 500. The semiconductor element 250 may include an active layer 130, a gate electrode 170, a source electrode 210, and a drain electrode 230, and the display structure may include a lower electrode 290, a light emitting layer 330, and an upper electrode 340. The thin film encapsulation structure 450 may include a first encapsulation layer 451, a second encapsulation layer 452, and a third encapsulation layer 453.

The display device 100 may include the flexible substrate 110 and the thin film encapsulation structure 450, and the display device 100 may serve as a flexible display device.

The substrate 110 may be provided. The substrate 110 may include transparent materials. The substrate 110 may be formed of a flexible transparent material such as a flexible transparent resin substrate (e.g., a polyimide substrate). For example, the polyimide substrate may include a first polyimide layer, a first barrier film layer, a second polyimide layer, and a second barrier film layer. The polyimide substrate may be relatively thin and flexible, and the polyimide substrate may be disposed on a rigid glass substrate to help support the formation of an upper structure (e.g., the semiconductor element 250 and the display structure). For example, the substrate 110 may have a structure in which the first polyimide layer, the first barrier film layer, the second polyimide layer, and the second barrier film layer are stacked on the rigid glass substrate. In a manufacturing the display device 100, after an insulating layer (e.g., a buffer layer) is provided on the second barrier layer of the polyimide substrate, the upper structure may be disposed on the insulating layer. After the upper structure is formed on the insulating layer, the rigid glass substrate under which the polyimide substrate is disposed may be removed. The polyimide substrate may be relatively thin and flexible, and it may be difficult to directly form the upper structure on the polyimide substrate. The upper structure may be formed on the polyimide substrate and the rigid glass substrate, and then the polyimide substrate may serve as the substrate 110 of the display device 100 after the removal of the rigid glass substrate. In an embodiment, the substrate 110 may include, for example, a quartz substrate, a synthetic quartz substrate, a calcium fluoride substrate, a fluoride-doping quartz substrate, a sodalime substrate, or a non-alkali substrate.

A buffer layer may be disposed on the substrate 110. The buffer layer may be disposed on the entire substrate 110. The buffer layer may prevent the diffusion of metal atoms and/or impurities from the substrate 110. The buffer layer may control a rate of a heat transfer in a crystallization process for forming the active layer 130, and a substantially uniform active layer 130 may be obtained. The buffer layer may improve a surface flatness of the substrate 110 when a surface of the substrate 110 is relatively irregular. According to a type of the substrate 110, at least two buffer layers may be provided on the substrate 110, or the buffer layer may not be disposed. For example, the buffer layer may include silicon oxide, silicon nitride, or silicon oxynitride.

The semiconductor element 250 may be disposed on the substrate 110. The semiconductor element 250 may be formed of the active layer 130, the gate electrode 170, the source electrode 210, and the drain electrode 230. For example, the active layer 130 may be disposed on the substrate 110. The active layer 130 may be formed of, for example, an oxide semiconductor, an inorganic semiconductor (e.g., amorphous silicon or polysilicon), or an organic semiconductor.

The gate insulation layer 150 may be disposed on the active layer 130. The gate insulation layer 150 may cover the active layer 130, and may be disposed on the entire substrate 110. In example embodiments, the gate insulation layer 150 may sufficiently cover the active layer 130, and may have a substantially level surface without a step around the active layer 130. In an embodiment, the gate insulation layer 150 may cover the active layer 130, and may be disposed as a substantially uniform thickness along a profile of the active layer 130. The gate insulation layer 150 may include, for example, a silicon compound or a metal oxide. For example, the gate insulation layer 150 may be formed of silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($Al_x$), aluminum nitride ($AlN_x$), tantalum oxide ($TaO_x$), hafnium oxide ($HfO_x$), zirconium oxide ($ZrO_x$), or titanium oxide ($TiO_x$).

The gate electrode 170 may be disposed on a portion of the gate insulation layer 150 under which the active layer 130 is located. The gate electrode 170 may include, for example, a metal, a metal alloy, a metal nitride, a conductive metal oxide, or a transparent conductive material. For example, the gate electrode 170 may be formed of aluminum (Al), an alloy of aluminum, aluminum nitride ($AlN_x$), silver (Ag), an alloy of silver, tungsten (W), tungsten nitride ($WN_x$), copper (Cu), an alloy of copper, nickel (Ni), chrome (Cr), chrome nitride ($CrN_x$), molybdenum (Mo), an alloy of molybdenum, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), stannum oxide ($SnO_x$), indium oxide ($InO_x$), gallium oxide ($GaO_x$), indium tin oxide (ITO), or indium zinc oxide (IZO). These may be used alone or in a suitable combination thereof.

The insulating interlayer 190 may be disposed on the gate electrode 170. The insulating interlayer 190 may cover the gate electrode 170, and may be disposed on the entire gate insulation layer 150. In example embodiments, the insulating interlayer 190 may sufficiently cover the gate electrode 170, and may have a substantially level surface without a step around the gate electrode 170. In an embodiment, the insulating interlayer 190 may cover the gate electrode 170, and may be disposed as a substantially uniform thickness along a profile of the gate electrode 170. The insulating interlayer 190 may include, for example, a silicon compound or a metal oxide.

The source electrode 210 and the drain electrode 230 may be disposed on the insulating interlayer 190. The source electrode 210 may be in contact with a first side of the active layer 130 by removing a portion of the gate insulation layer 150 and the insulating interlayer 190. The drain electrode 230 may be in contact with a second side of the active layer 130 by removing another portion of the gate insulation layer 150 and the insulating interlayer 190. The source electrode 210 and the drain electrode 230 may include, for example, a metal, an alloy, a metal nitride, a conductive metal oxide, or a transparent conductive material. These may be used alone or in a suitable combination thereof.

The planarization layer 270 may be disposed on the source electrode 210 and the drain electrode 230. The planarization layer 270 may cover the source electrode 210 and the drain electrode 230, and may be disposed on the entire insulating interlayer 190. In example embodiments, the planarization layer 270 may be disposed as a high thickness to sufficiently cover the source and drain electrodes 210 and 230. The planarization layer 270 may have a substantially flat upper surface, and a planarization process may be further performed on the planarization layer 270 to implement the flat upper surface of the planarization layer 270. In an embodiment, the planarization layer 270 may cover the source and drain electrodes 210 and 230, and may be disposed as a substantially uniform thickness along a profile of the source and drain electrodes 210 and 230. The planarization layer 270 may include organic materials or inorganic materials. In example embodiments, the planarization layer 270 may include organic materials.

The lower electrode 290 may be disposed on the planarization layer 270. The lower electrode 290 may be in contact with the drain electrode 230 by removing a portion of the planarization layer 270. The lower electrode 290 may be electrically connected to the semiconductor element 250. The lower electrode 290 may include, for example, a metal, a metal alloy, a metal nitride, a conductive metal oxide, or a transparent conductive material. These may be used alone or in a suitable combination thereof.

The pixel defining layer 310 may be disposed on the planarization layer 270, and may expose a portion of the lower electrode 290. The light emitting layer 330 may be disposed on the portion of the lower electrode 290 exposed by the pixel defining layer 310. The pixel defining layer 310 may include organic materials or inorganic materials. In example embodiments, the pixel defining layer 310 may include organic materials.

The light emitting layer 330 may be disposed in a portion where the portion of the lower electrode 290 is exposed. The light emitting layer 330 may be formed using one or more light emitting materials that may be capable of generating different colors of light (e.g., a red light, a blue light, and a green light) according to sub-pixels. In an embodiment, the light emitting layer 330 may generally generate a white light by stacking a plurality of light emitting materials that may be capable of generating different colors of light such as a red light, a green light, and a blue light. A color filter may be disposed on the light emitting layer 330. The color filter may include one or more of a red color filter, a green color filter, or a blue color filter. In an embodiment, the color filter may include a yellow color filter, a cyan color filter, and a magenta color filter. The color filter may be formed of, for example, a photosensitive resin (or color photoresist).

The upper electrode 340 may be disposed on the pixel defining layer 310 and the light emitting layer 330. The upper electrode 340 may include, for example, a metal, a metal alloy, a metal nitride, a conductive metal oxide, or a transparent conductive material.

The thin film encapsulation structure 450 may be disposed on the upper electrode 340. The thin film encapsulation structure 450 may include the first encapsulation layer 451, the second encapsulation layer 452, and the third encapsulation layer 453. For example, the second encapsulation layer 452 may be disposed on the first encapsulation layer 451, and the third encapsulation layer 453 may be disposed on the second encapsulation layer 452. The first encapsulation layer 451 may be disposed on the upper electrode 340. The first encapsulation layer 451 may cover the upper electrode 340, and may be disposed as a substantially uniform thickness along a profile of the upper electrode 340. The first encapsulation layer 451 may prevent the display structure from being deteriorated by the permeation of, for example, moisture, water, or oxygen. The first encapsulation layer 451 may protect the display structure from external impacts. The first encapsulation layer 451 may include inorganic materials.

The second encapsulation layer 452 may be disposed on the first encapsulation layer 451. The second encapsulation layer 452 may improve the flatness of the display device 100, and may protect the display structure. The second encapsulation layer 452 may include organic materials.

The third encapsulation layer 453 may be disposed on the second encapsulation layer 452. The third encapsulation layer 453 may cover the second encapsulation layer 452, and may be disposed as a substantially uniform thickness along a profile of the second encapsulation layer 452. The third encapsulation layer 453 together with the first encapsulation layer 451 and the second encapsulation layer 452 may prevent the display structure from being deteriorated by the permeation of, for example, moisture, water, or oxygen. The third encapsulation layer 453 together with the first encapsulation layer 451 and the second encapsulation layer 452 may protect the display structure from external impacts. The third encapsulation layer 453 may include inorganic materials.

In an embodiment, the thin film encapsulation structure 450 may have five layers structure where first to fifth encapsulation layers are stacked or seven layers structure where the first to seventh encapsulation layers are stacked.

The polarizer 400 may be disposed on the thin film encapsulation structure 450. The polarizer 400 may include a linearly polarized film and a $\lambda/4$ phase retardation film. The $\lambda/4$ phase retardation film may be disposed on the thin film encapsulation structure 450. The $\lambda/4$ phase retardation film may convert a phase of the light. For example, the $\lambda/4$ phase retardation film may convert the light vibrating up and down or the light vibrating left and right into right-circularly polarized light or left-circularly polarized light, respectively. The $\lambda/4$ phase retardation film may convert the right-circularly polarized light or the left-circularly polarized light into the light vibrating up and down or the light vibrating left and right, respectively. The $\lambda/4$ phase retardation film may include, for example, a birefringent film containing polymer, an orientation film of a liquid crystal polymer, or an alignment layer of a liquid crystal polymer.

The linearly polarized film may be disposed on the $\lambda/4$ phase retardation film. The linearly polarized film may selectively transmit the incident light. For example, the linearly polarized film may transmit the light vibrating up and down or vibrating left and right. The linearly polarized film may include a pattern of horizontal stripes or vertical stripes. When the linearly polarized film includes a pattern of horizontal stripes, the linearly polarized film may block the light vibrating up and down, and may transmit the light vibrating left and right. When the linearly polarized film includes a pattern of vertical stripes, the linearly polarized film may block the light vibrating left and right, and may transmit the light vibrating up and down.

The light transmitting the linearly polarized film may transmit the λ/4 phase retardation film. As described above, the λ/4 phase retardation film may convert a phase of the light. For example, when the incident light vibrating up, down, left, and right passes through the linearly polarized film, the linearly polarized film including a pattern of the horizontal stripes may transmit the light vibrating left and right. When the incident light vibrating left and right passes through the λ/4 phase retardation film, the incident light vibrating left and right may be converted into the left-circularly polarized light. The incident light including the left-circularly polarized light may be reflected at the cathode electrode (e.g., the upper electrode 340) of the display panel 200, and then the incident light may be converted into the right-circularly polarized light. When the incident light including the right-circularly polarized light passes through the λ/4 phase retardation film, the incident light may be converted into the light vibrating up and down. The light vibrating up and down may be blocked by the linearly polarized film including a pattern of the horizontal stripes, and the incident light may be removed by the linearly polarized film and the λ/4 phase retardation film (i.e., the polarizer 400). For example, the linearly polarized film may include iodine-based materials, materials containing dye, or polyene-based materials.

The touch screen panel 500 may be disposed on the polarizer 400. The touch screen panel 500 may include, for example, a bottom polyethylene terephthalate (PET) film, touch screen panel electrodes, and a top PET film. The bottom PET film and/or the top PET film may protect the touch screen panel electrodes. For example, the top PET film and the bottom PET film may include polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), or modified polyphenylene oxide (MPPO). The touch screen panel electrodes may substantially have a metal mesh structure. For example, the touch screen panel electrodes may include carbon nanotube (CNT), transparent conductive oxide (TCO), indium tin oxide (ITO), indium gallium zinc oxide (IGZO), zinc oxide (ZnO), graphene, silver nanowire (AgNW), copper (Cu), or chrome (Cr).

The first transparent magnetic layer 300 may be disposed on a lower surface of the display panel 200. As the first transparent magnetic layer 300 is disposed on a lower surface of the substrate 110, the first transparent magnetic layer 300 may protect the substrate 110 of the display panel 200. The second transparent magnetic layer 600 may be disposed on an upper surface of the touch screen panel 500. In some example embodiments, a hard coating layer may be additionally disposed on the second transparent magnetic layer 600. The hard coating layer may protect the display device 100. An antibacterial coating layer, an anti-reflective coating layer, a super-hydrophobic coating layer, or an anti-fingerprint coating layer, for example, may be additionally included.

The first transparent magnetic layer 300 and the second transparent magnetic layer 600 may be substantially transparent, and may have characteristics of the magnet. For example, an attractive force may be applied between the first transparent magnetic layer 300 and the second transparent magnetic layer 600. The display panel 200 and the upper member (e.g., the polarizer 400 and the touch screen panel 500) that are disposed between the first and second transparent magnetic layers 300 and 600 may be fixed between the first and second transparent magnetic layers 300 and 600 through the attractive force.

Each of the first and second transparent magnetic layers 300 and 600 may have the same materials. For example, the first transparent magnetic layer 300 may be the substantially same as the second transparent magnetic layer 600. The materials included in each of the first and second transparent magnetic layers 300 and 600 may have a nanotube structure of one-dimensional carbon nitride having a cylindrical shape. When the nanotube structure of carbon nitride including, e.g., consisting of, carbon and nitrogen has armchair shapes and zigzag shapes, the nanotube structure of carbon nitride may be transparent in visible ray area, and may have characteristics of the magnet. According to the characteristics, the attractive force may be applied between the first and second transparent magnetic layers 300 and 600, and a light emitted from the light emitting layer 330 may penetrate the second transparent magnetic layer 600.

The display device 100 in accordance with example embodiments includes the first transparent magnetic layer 300 and the second transparent magnetic layer 600, and the upper member may be fixed between the first and second transparent magnetic layers 300 and 600 without adhesive films. The display device 100 may be repeatedly bent or folded, and the display device 100 may not be delaminated, and may maintain a function of a flexible display device.

FIGS. 3 to 9 illustrate cross-sectional views of a method of manufacturing a display device in accordance with example embodiments.

Figure 3:
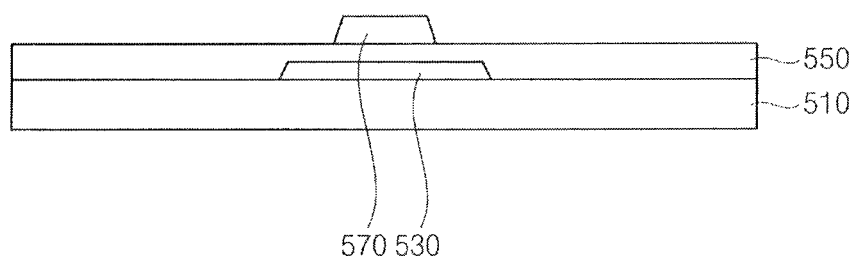
FIGS. 3 to 9 illustrate cross-sectional views of a method of manufacturing a display device in accordance with example embodiments.

Referring to FIG. 3, a substrate 510 may be provided. The substrate 510 may include transparent materials. The substrate 510 may be formed using a flexible transparent material such as a flexible transparent resin substrate (e.g., a polyimide substrate). The polyimide substrate may include a first polyimide layer, a first barrier film layer, a second polyimide layer, and a second barrier film layer.

A buffer layer may be formed on the substrate 510. The buffer layer may be formed on the entire substrate 510. The buffer layer may be formed using, for example, silicon oxide, silicon nitride, or silicon oxynitride.

An active layer 530 may be formed on the substrate 510. The active layer 530 may be formed using, for example, an oxide semiconductor, an inorganic semiconductor (e.g., amorphous silicon or polysilicon), or an organic semiconductor.

A gate insulation layer 550 may be formed on the active layer 530. The gate insulation layer 550 may cover the active layer 530, and may be formed on the entire substrate 510. The gate insulation layer 550 may sufficiently cover the active layer 530, and may have a substantially level surface without a step around the active layer 530. In an embodiment, the gate insulation layer 550 may cover the active layer 530, and may be formed as a substantially uniform thickness along a profile of the active layer 530. The gate insulation layer 550 may include, for example, a silicon compound or a metal oxide. For example, the gate insulation layer 550 may be formed using $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, or $TiO_x$.

A gate electrode 570 may be formed on a portion of the gate insulation layer 550 under which the active layer 530 is located. The gate electrode 570 may include, for example, a metal, a metal alloy, a metal nitride, a conductive metal oxide, or a transparent conductive material. For example, the gate electrode 570 may be formed using Al, an alloy of aluminum, $AlN_x$, Ag, an alloy of silver, W, $WN_x$, Cu, an alloy of copper, Ni, Cr, $CrN_x$, Mo, an alloy of molybdenum, Ti, $TiN_x$, Pt, Ta, $TaN_x$, Nd, Sc, SRO, $Zn_x$, $SnO_x$, $InO_x$, $GaO_x$, ITO, or IZO. These may be used alone or in a suitable combination thereof.

Figure 4:
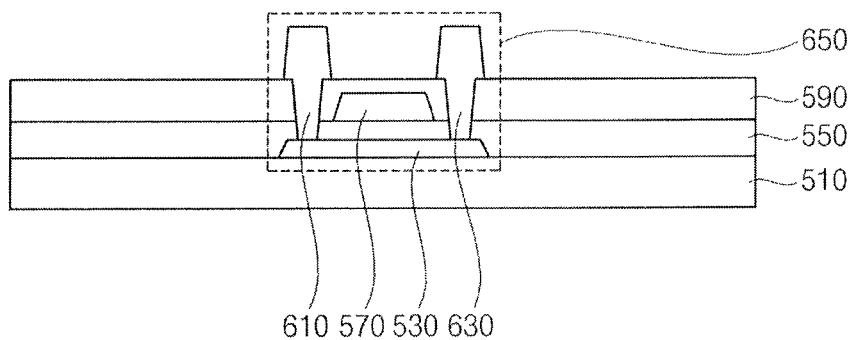

Referring to FIG. 4, an insulating interlayer 590 may be formed on the gate electrode 570. The insulating interlayer 590 may cover the gate electrode 570, and may be formed on the entire gate insulation layer 550. The insulating interlayer 590 may sufficiently cover the gate electrode 570, and may have a substantially level surface without a step around the gate electrode 570. In an embodiment, the insulating interlayer 590 may cover the gate electrode 570, and may be formed as a substantially uniform thickness along a profile of the gate electrode 570. The insulating interlayer 590 may be formed using, for example, a silicon compound or a metal oxide.

A source electrode 610 and a drain electrode 630 may be formed on the insulating interlayer 590. The source electrode 610 may be in contact with a first side of the active layer 530 by removing a portion of the gate insulation layer 550 and the insulating interlayer 590. The drain electrode 630 may be in contact with a second side of the active layer 530 by removing another portion of the gate insulation layer 550 and the insulating interlayer 590. The source electrode 610 and the drain electrode 630 may be formed using, for example, a metal, an alloy, a metal nitride, a conductive metal oxide, or a transparent conductive material. These may be used alone or in a suitable combination thereof. A semiconductor element 650 including the active layer 530, the gate electrode 570, the source electrode 610, and the drain electrode 630 may be formed.

Figure 5:
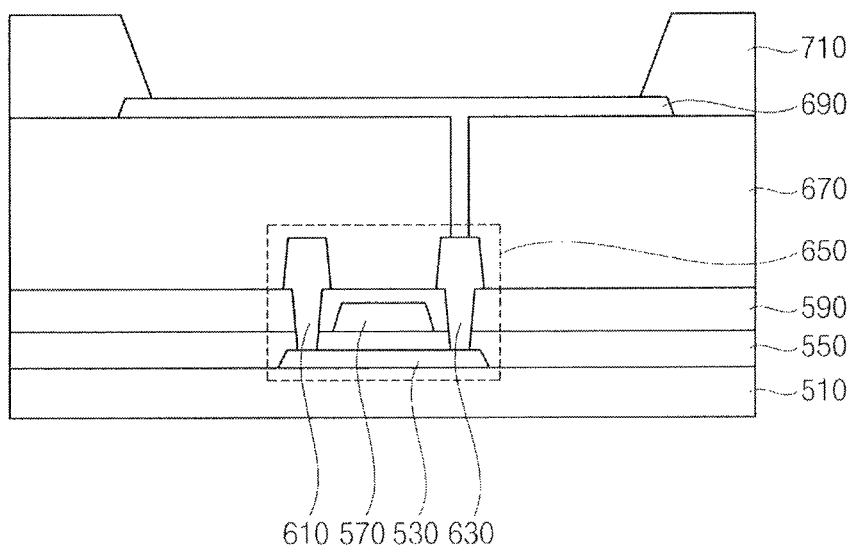

Referring to FIG. 5, a planarization layer 670 may be formed on the source electrode 610 and the drain electrode 630. The planarization layer 670 may cover the source electrode 610 and the drain electrode 630, and may be formed on the entire insulating interlayer 590. The planarization layer 670 may be formed as a high thickness to sufficiently cover the source and drain electrodes 610 and 630. The planarization layer 670 may have a substantially flat upper surface, and a planarization process may be further performed on the planarization layer 670 to implement the flat upper surface of the planarization layer 670. The planarization layer 670 may be formed using organic materials or inorganic materials.

A lower electrode 690 may be formed on the planarization layer 670. The lower electrode 690 may be in contact with the drain electrode 630 by removing a portion of the planarization layer 670. The lower electrode 690 may be electrically connected to the semiconductor element 650. The lower electrode 690 may be formed using, for example, a metal, a metal alloy, a metal nitride, a conductive metal oxide, or a transparent conductive material. These may be used alone or in a suitable combination thereof.

A pixel defining layer 710 may be formed on the planarization layer 670, and may expose a portion of the lower electrode 690. The pixel defining layer 710 may be formed using organic materials or inorganic materials.

Figure 6:
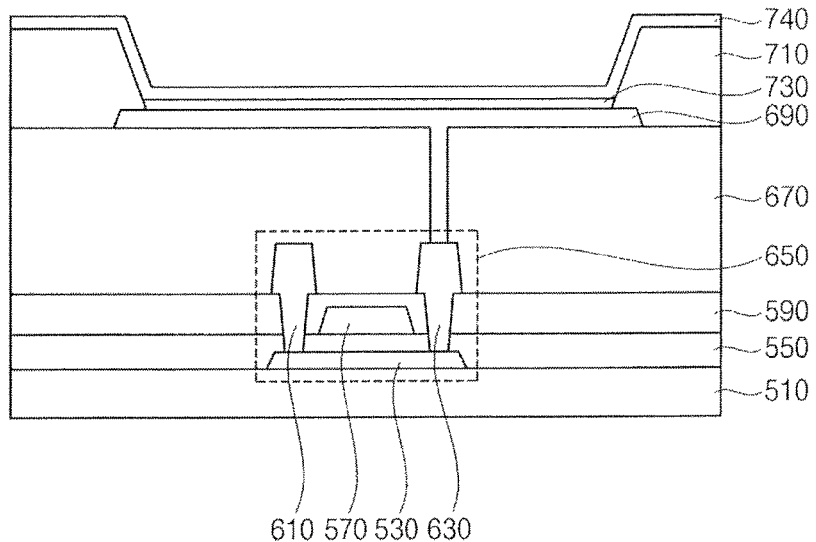

Referring to FIG. 6, a light emitting layer 730 may be formed in a portion where the portion of the lower electrode 690 is exposed. The light emitting layer 730 may be formed using one or more light emitting materials that may be capable of generating different colors of light (e.g., a red light, a blue light, and a green light) according to sub-pixels. In an embodiment, the light emitting layer 730 may generally generate a white light by stacking a plurality of light emitting materials that may be capable of generating different colors of light such as, for example, a red light, a green light, and a blue light. A color filter may be disposed on the light emitting layer 330.

An upper electrode 740 may be formed on the pixel defining layer 710 and the light emitting layer 730. The upper electrode 740 may be formed using, for example, a metal, a metal alloy, a metal nitride, a conductive metal oxide, or a transparent conductive material.

Figure 7:
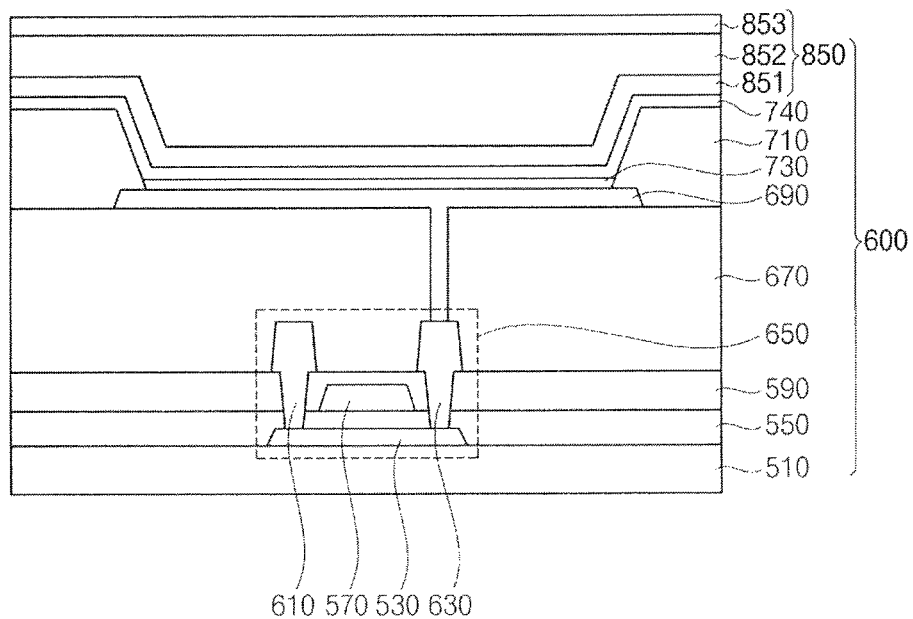

Referring to FIG. 7, a thin film encapsulation structure 850 may be formed on the upper electrode 740. The thin film encapsulation structure 850 may include a first encapsulation layer 851, a second encapsulation layer 852, and a third encapsulation layer 853. For example, the second encapsulation layer 852 may be formed on the first encapsulation layer 851, and the third encapsulation layer 853 may be formed on the second encapsulation layer 852. The first encapsulation layer 851 may be formed on the upper electrode 740. The first encapsulation layer 851 may cover the upper electrode 740, and may be formed as a substantially uniform thickness along a profile of the upper electrode 740. The first encapsulation layer 851 may prevent the display structure from being deteriorated by the permeation of, for example, moisture, water, or oxygen. The first encapsulation layer 851 may protect a display structure from external impacts. The first encapsulation layer 851 may be formed using inorganic materials.

The second encapsulation layer 852 may be formed on the first encapsulation layer 851. The second encapsulation layer 852 may improve the flatness of a display device, and may protect the display structure. The second encapsulation layer 852 may be formed using organic materials.

The third encapsulation layer 853 may be disposed on the second encapsulation layer 852. The third encapsulation layer 853 may cover the second encapsulation layer 452, and may be formed as a substantially uniform thickness along a profile of the second encapsulation layer 852. The third encapsulation layer 853 together with the first encapsulation layer 851 and the second encapsulation layer 852 may prevent the display structure from being deteriorated by the permeation of, for example, moisture, water, or oxygen. The third encapsulation layer 853 together with the first encapsulation layer 851 and the second encapsulation layer 852 may protect the display structure from external impacts. The third encapsulation layer 853 may be formed using inorganic materials.

Figure 8:
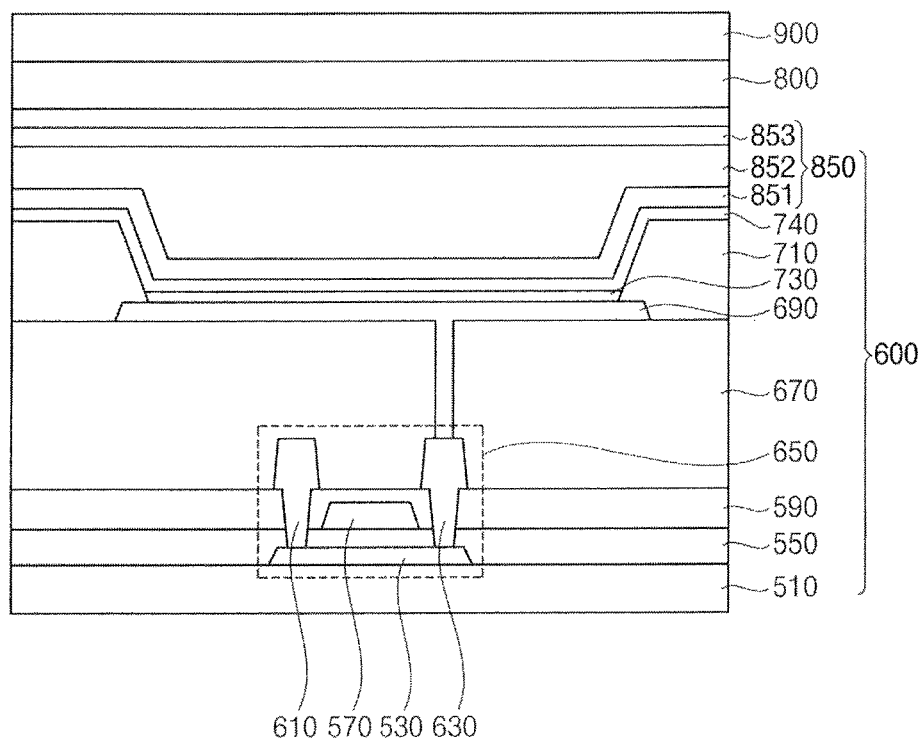

Referring to FIG. 8, a polarizer 800 may be formed on the thin film encapsulation structure 850. The polarizer 800 may include a linearly polarized film and a λ/4 phase retardation film. The λ/4 phase retardation film may be formed using, for example, a birefringent film containing polymer, an orientation film of a liquid crystal polymer, or an alignment layer of a liquid crystal polymer.

The linearly polarized film may be formed on the λ/4 phase retardation film. The linearly polarized film may selectively transmit the incident light. The linearly polarized film may be formed using, for example, iodine-based materials, materials containing dye, or polyene-based materials.

A touch screen panel 900 may be formed on the polarizer 800. The touch screen panel 900 may include, for example, a bottom PET film, touch screen panel electrodes, and a top PET film. The bottom PET film and/or the top PET film may protect the touch screen panel electrodes. For example, each of the top PET film and the bottom PET film may be formed using, for example, PET, PEN, PP, PC, PS, PSul, PE, PPA, PES, PAR, PCO, or MPPO. The touch screen panel electrodes may substantially have a metal mesh structure. For example, the touch screen panel electrodes may be formed using, for example, CNT, TCO, ITO, IGZO, ZnO, graphene, AgNW, Cu, or Cr.

Figure 9:
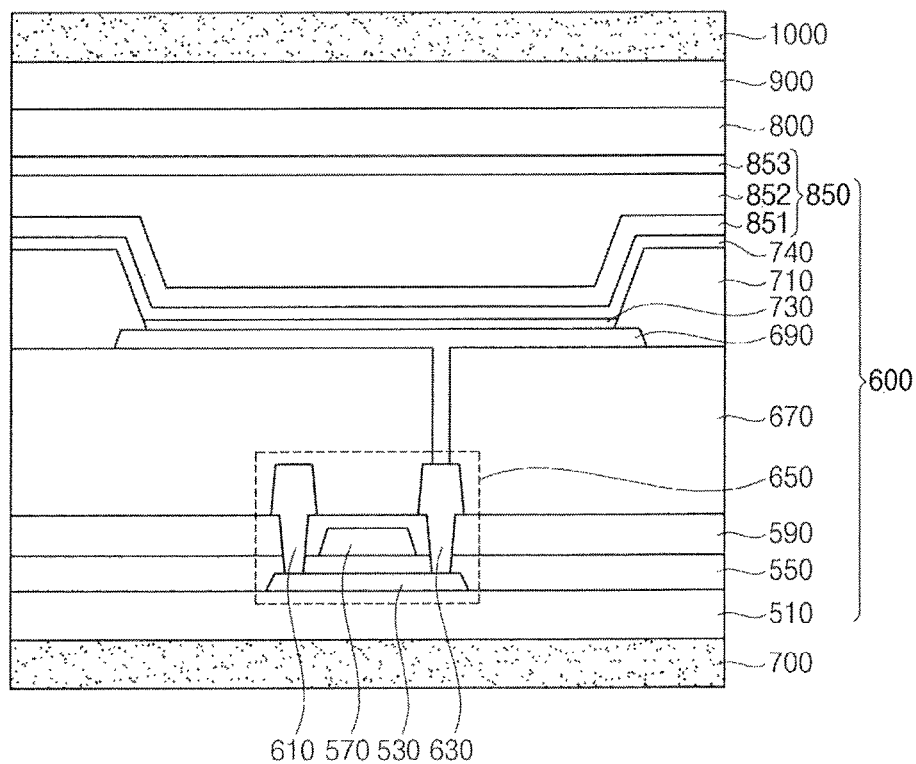

Referring to FIG. 9, a first transparent magnetic layer 700 may be formed on a lower surface of a display panel 600. The first transparent magnetic layer 700 may be formed on a lower surface of the substrate 510, and the first transparent magnetic layer 700 may protect the substrate 510 of the display panel 600. The second transparent magnetic layer 1000 may be formed on an upper surface of the touch screen panel 900.

The first transparent magnetic layer 700 and the second transparent magnetic layer 1000 may be substantially transparent, and may have characteristics of the magnet. For example, an attractive force may be applied between the first transparent magnetic layer 700 and the second transparent magnetic layer 1000. The display panel 600 and an upper member (e.g., the polarizer 800 and the touch screen panel 900) that are formed between the first and second transparent magnetic layers 700 and 1000 may be fixed between the first and second transparent magnetic layers 700 and 1000 through the attractive force.

Each of the first and second transparent magnetic layers 700 and 1000 may have the same materials. For example, the first transparent magnetic layer 700 may be the substantially same as the second transparent magnetic layer 1000. The materials included in each of the first and second transparent magnetic layers 700 and 1000 may have a nanotube structure of one-dimensional carbon nitride having a cylindrical shape. When the nanotube structure of carbon nitride including, e.g., consisting of, carbon and nitrogen has armchair shapes and zigzag shapes, the nanotube structure of carbon nitride may be transparent in visible ray area, and may have characteristics of the magnet. According to the characteristics, the attractive force may be applied between the first and second transparent magnetic layers 700 and 1000, and a light emitted from the light emitting layer 730 may penetrate the second transparent magnetic layer 1000. The display device 100 illustrated in FIG. 2 may be manufactured.

Figure 10:
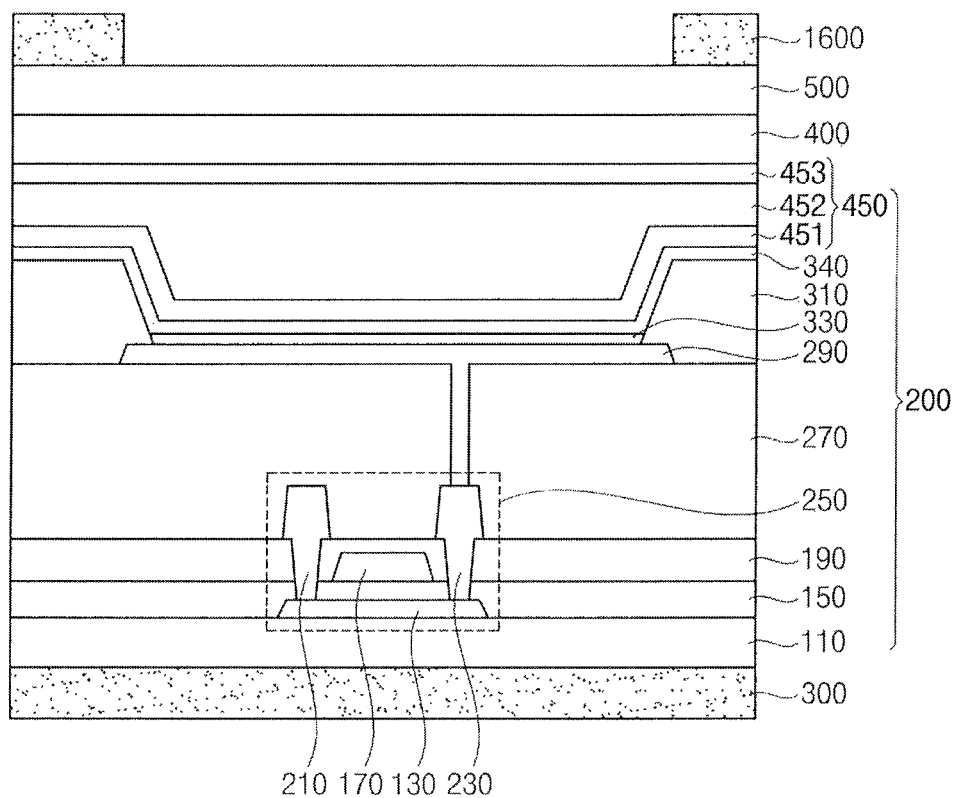
FIG. 10 illustrates a cross-sectional view of a display device in accordance with example embodiments.
Figure 11:
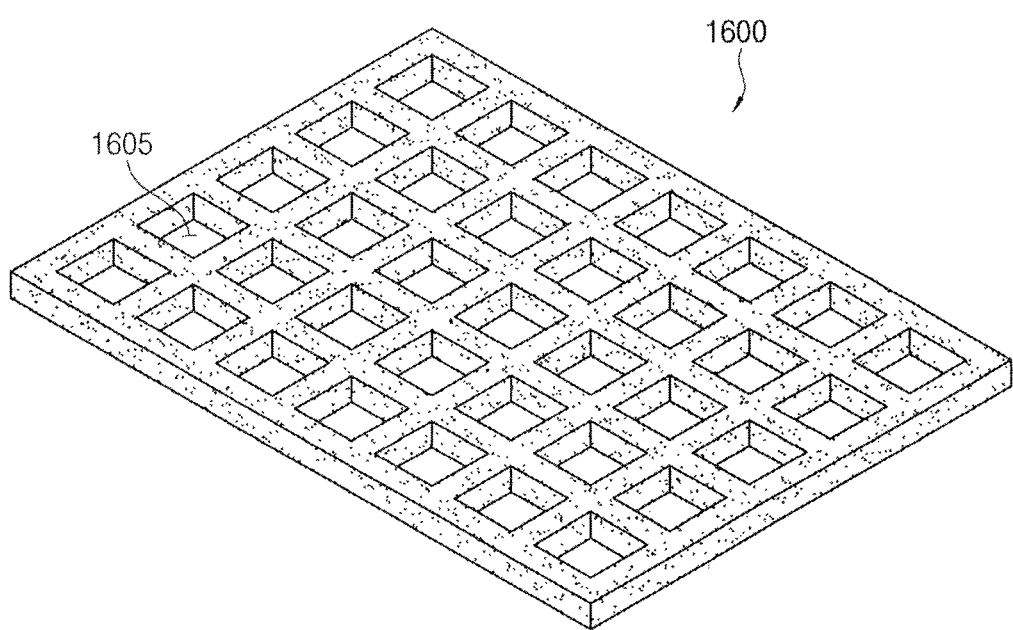
FIG. 11 illustrates a cross-sectional view for describing a second transparent magnetic layer included in a display device of FIG. 10.

FIG. 10 illustrates a cross-sectional view of a display device in accordance with example embodiments, and FIG. 11 is a cross-sectional view for describing a second transparent magnetic layer included in a display device of FIG. 10. A display device illustrated in FIG. 10 may have a configuration substantially the same as or similar to that of a display device 100 described with reference to FIG. 2 except a second transparent magnetic layer 1600. In FIG. 10, detailed descriptions for elements, which are substantially the same as or similar to the elements described with reference to FIG. 2, will be omitted.

Referring to FIGS. 10 and 11, a display device may include a first transparent magnetic layer 300, a display panel 200, an upper member, and a second transparent magnetic layer 1600. The display panel 200 may include, for example, a substrate 110, a semiconductor element 250, a gate insulation layer 150, an insulating interlayer 190, a planarization layer 270, a pixel defining layer 310, a display structure, and a thin film encapsulation structure 450. The upper member may include a polarizer 400 and a touch screen panel 500. The semiconductor element 250 may include an active layer 130, a gate electrode 170, a source electrode 210, and a drain electrode 230, and the display structure may include a lower electrode 290, a light emitting layer 330, and an upper electrode 340. The thin film encapsulation structure 450 may include a first encapsulation layer 451, a second encapsulation layer 452, and a third encapsulation layer 453.

The first transparent magnetic layer 300 may be disposed on a lower surface of the display panel 200. As the first transparent magnetic layer 300 is disposed on a lower surface of the substrate 110, the first transparent magnetic layer 300 may protect the substrate 110 of the display panel 200. The second transparent magnetic layer 1600 may be disposed on an upper surface of the touch screen panel 500.

The first transparent magnetic layer 300 and the second transparent magnetic layer 1600 may be substantially transparent, and may have characteristics of the magnet. For example, an attractive force may be applied between the first transparent magnetic layer 300 and the second transparent magnetic layer 1600. The display panel 200 and the upper member (e.g., the polarizer 400 and the touch screen panel 500) that are disposed between the first and second transparent magnetic layers 300 and 1600 may be fixed between the first and second transparent magnetic layers 300 and 1600 through the attractive force.

Each of the first and second transparent magnetic layers 300 and 1600 may have the same materials. For example, the first transparent magnetic layer 300 may be the substantially same as the second transparent magnetic layer 1600. The materials included in each of the first and second transparent magnetic layers 300 and 1600 may have a nanotube structure of one-dimensional carbon nitride having a cylindrical shape. When the nanotube structure of carbon nitride including, e.g., consisting of, carbon and nitrogen has armchair shapes and zigzag shapes, the nanotube structure of carbon nitride may be transparent in visible ray area, and may have characteristics of the magnet. According to the characteristics, the attractive force may be applied between the first and second transparent magnetic layers 300 and 1600, and a light emitted from the light emitting layer 330 may penetrate the second transparent magnetic layer 1600.

The second transparent magnetic layer 1600 may have a mesh structure including a plurality of openings 1605. A light emitted from the light emitting layer 330 may travel through the openings 1605, a transmissivity of the light may be improved, and the display device may serve as a flexible display device having a relatively improved light transmissivity.

Figure 12:
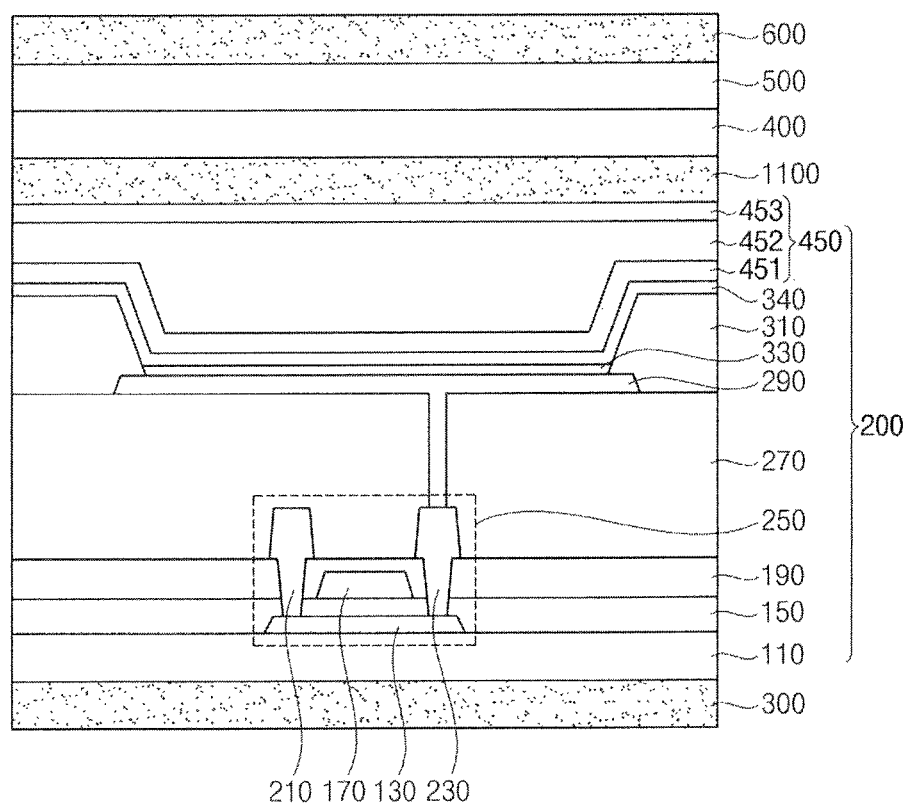
FIG. 12 illustrates a cross-sectional view of a display device in accordance with example embodiments.
Figure 13:
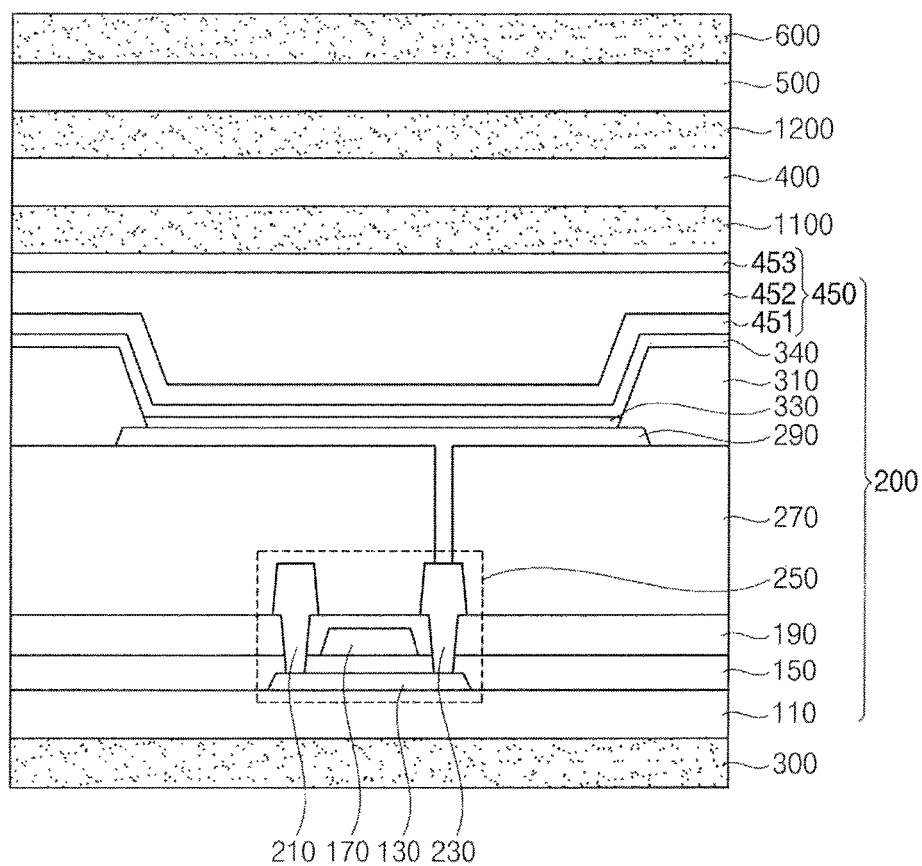
FIG. 13 illustrates a cross-sectional view of a display device in accordance with example embodiments.

FIG. 12 illustrates a cross-sectional view of a display device in accordance with example embodiments, and FIG. 13 illustrates a cross-sectional view of a display device in accordance with example embodiments. A display device illustrated in FIGS. 12 and 13 may have a configuration substantially the same as or similar to that of a display device 100 described with reference to FIG. 2 except a third transparent magnetic layer 1100 and a fourth transparent magnetic layer 1200. In FIGS. 12 and 13, detailed descriptions for elements, which are substantially the same as or similar to the elements described with reference to FIG. 2, will be omitted.

Referring to FIG. 12, a display device may include a first transparent magnetic layer 300, a display panel 200, an upper member, a third transparent magnetic layer 1100, and a second transparent magnetic layer 600. The display panel 200 may include, for example, a substrate 110, a semiconductor element 250, a gate insulation layer 150, an insulating interlayer 190, a planarization layer 270, a pixel defining layer 310, a display structure, and a thin film encapsulation structure 450. The upper member may include a polarizer 400 and a touch screen panel 500. The semiconductor element 250 may include an active layer 130, a gate electrode 170, a source electrode 210, and a drain electrode 230, and the display structure may include a lower electrode 290, a light emitting layer 330, and an upper electrode 340. The thin film encapsulation structure 450 may include a first encapsulation layer 451, a second encapsulation layer 452, and a third encapsulation layer 453.

The third transparent magnetic layer 1100 may be disposed between the display panel 200 and the polarizer 400, and the touch screen panel 500 may be disposed on the polarizer 400. The first transparent magnetic layer 300 may be disposed on a lower surface of the display panel 200, and the second transparent magnetic layer 600 may be disposed on an upper surface of the touch screen panel 500.

The first transparent magnetic layer 300, the second transparent magnetic layer 600, and the third transparent magnetic layer 1100 may be substantially transparent, and may have characteristics of the magnet. For example, an attractive force may be applied between the first transparent magnetic layer 300 and the third transparent magnetic layer 1100, and an attractive force may be applied between the third transparent magnetic layer 1100 and the second transparent magnetic layer 600. An attractive force may be applied between the first transparent magnetic layer 300 and the second transparent magnetic layer 600. The display panel 200, the polarizer 400 and the touch screen panel 500 that are disposed between the first, second, and third transparent magnetic layers 300, 600, and 1100 may be fixed between the first, second, third transparent magnetic layers 300, 600, and 1100 through the attractive force.

Each of the first, second, and third transparent magnetic layers 300, 600, and 1100 may have the same materials. For example, the first and second transparent magnetic layers 300 and 600 may be the substantially same as the third transparent magnetic layer 1100.

As the display device includes the first transparent magnetic layer 300, the second transparent magnetic layer 600, and the third transparent magnetic layer 1100, the display device may obtain, e.g., have, a relatively large attractive force. The display device may fix the display panel 200, the polarizer 400, and the touch screen panel 500 that are disposed between the first transparent magnetic layer 300, the second transparent magnetic layer 600, and the third transparent magnetic layer 1100 through the relatively large attractive force between the first transparent magnetic layer 300, the second transparent magnetic layer 600, and the third transparent magnetic layer 1100.

In some example embodiments, as illustrated in FIG. 13, the display device may further include a fourth transparent magnetic layer 1200 that is disposed between the polarizer 400 and the touch screen panel 500. An attractive force may be applied between the first, second, third, and fourth transparent magnetic layers 300, 600, 1100, and 1200 to each other, and the display panel 200, the polarizer 400, and the touch screen panel 500 that are disposed between the first, second, third, and fourth transparent magnetic layers 300, 600, 1100, and 1200 are fixed between the first, second, third, and fourth transparent magnetic layers 300, 600, 1100, and 1200 through the attractive force. The display device may have an increased attractive force.

Figure 14:
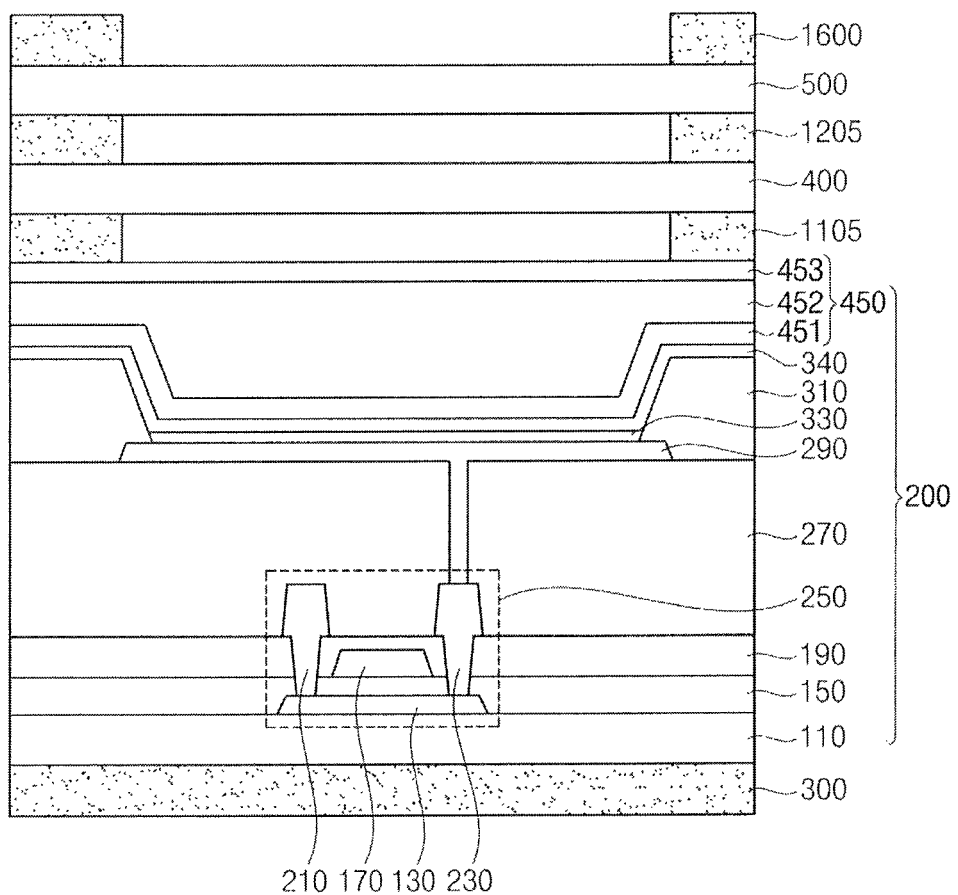
FIG. 14 illustrates a cross-sectional view of a display device in accordance with example embodiments.

FIG. 14 illustrates a cross-sectional view of a display device in accordance with example embodiments. A display device illustrated in FIG. 14 may have a configuration substantially the same as or similar to that of a display device 100 described with reference to FIG. 2 except a second transparent magnetic layer 1600, a third transparent magnetic layer 1105 and a fourth transparent magnetic layer 1205. In FIG. 14, detailed descriptions for elements, which are substantially the same as or similar to the elements described with reference to FIG. 2, will be omitted.

Referring to FIG. 14, a display device may include a first transparent magnetic layer 300, a display panel 200, an upper member, a third transparent magnetic layer 1105, a second transparent magnetic layer 1600, and a fourth transparent magnetic layer 1205. The display panel 200 may include, for example, a substrate 110, a semiconductor element 250, a gate insulation layer 150, an insulating interlayer 190, a planarization layer 270, a pixel defining layer 310, a display structure, and a thin film encapsulation structure 450. The upper member may include a polarizer 400 and a touch screen panel 500. The semiconductor element 250 may include an active layer 130, a gate electrode 170, a source electrode 210, and a drain electrode 230, and the display structure may include a lower electrode 290, a light emitting layer 330, and an upper electrode 340. The thin film encapsulation structure 450 may include a first encapsulation layer 451, a second encapsulation layer 452, and a third encapsulation layer 453.

The third transparent magnetic layer 1105 may be disposed between the display panel 200 and the polarizer 400. The third transparent magnetic layer 1105 may have a mesh structure including a plurality of openings. A light emitted from the light emitting layer 330 may travel through the openings.

The polarizer 400 may be disposed on the third transparent magnetic layer 1105, and the fourth transparent magnetic layer 1205 may be disposed on the polarizer 400. The fourth transparent magnetic layer 1205 may have a mesh structure including a plurality of openings, and a light emitted from the light emitting layer 330 may travel through the openings.

The touch screen panel 500 may be disposed on the fourth transparent magnetic layer 1205, and the second transparent magnetic layer 1600 may be disposed on the touch screen panel 500. The second transparent magnetic layer 1600 may have a mesh structure including a plurality of openings, and a light emitted from the light emitting layer 330 may travel through the openings. A display device including the first transparent magnetic layer 300, the second transparent magnetic layer 1600, the third transparent magnetic layer 1105, and the fourth transparent magnetic layer 1205 may serve as a flexible display device having a relatively improved transmissivity of a light and a relatively large attractive force.

Figure 15:
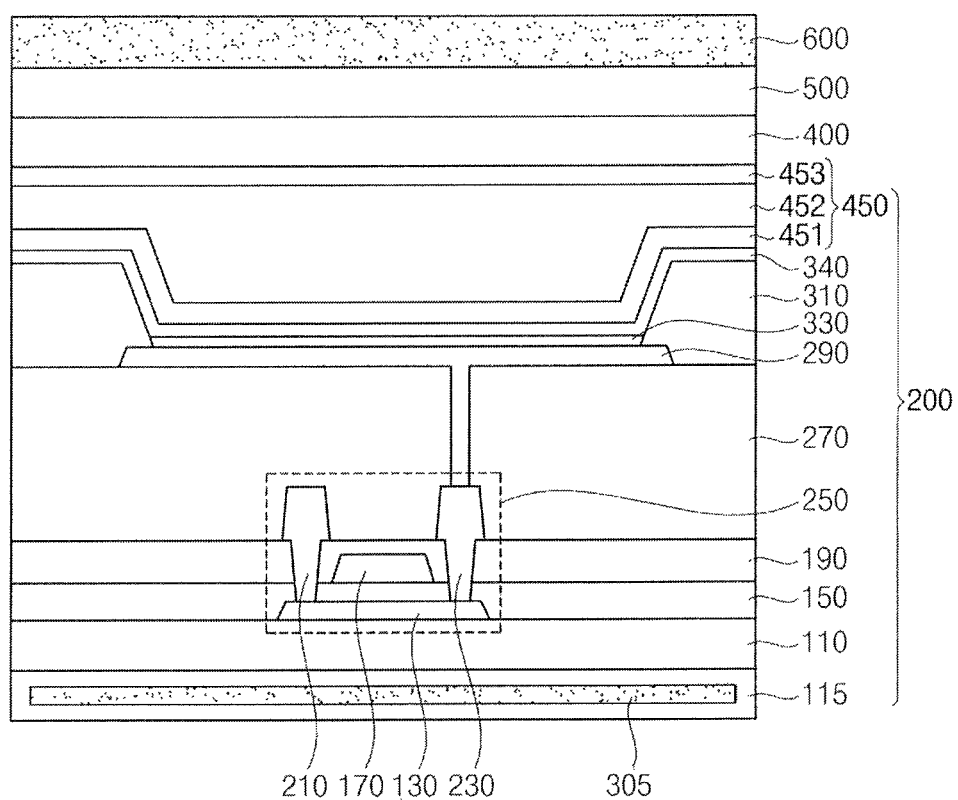
FIG. 15 illustrates a cross-sectional view of a display device in accordance with example embodiments.

FIG. 15 illustrates a cross-sectional view of a display device in accordance with example embodiments. A display device illustrated in FIG. 15 may have a configuration substantially the same as or similar to that of a display device 100 described with reference to FIG. 2 except a first transparent magnetic layer 305. In FIG. 14, detailed descriptions for elements, which are substantially the same as or similar to the elements described with reference to FIG. 2, will be omitted.

Referring to FIG. 15, a display device may include a first transparent magnetic layer 305, a display panel 200, an upper member, and a second transparent magnetic layer 600. The display panel 200 may include, for example, a substrate 115, a semiconductor element 250, a gate insulation layer 150, an insulating interlayer 190, a planarization layer 270, a pixel defining layer 310, a display structure, and a thin film encapsulation structure 450. The upper member may include a polarizer 400 and a touch screen panel 500. The semiconductor element 250 may include an active layer 130, a gate electrode 170, a source electrode 210, and a drain electrode 230, and the display structure may include a lower electrode 290, a light emitting layer 330, and an upper electrode 340. The thin film encapsulation structure 450 may include a first encapsulation layer 451, a second encapsulation layer 452, and a third encapsulation layer 453.

The substrate 115 may be provided. The substrate 115 may include transparent materials. The substrate 115 may be formed of a flexible transparent material such as a flexible transparent resin substrate (e.g., a polyimide substrate). For example, the polyimide substrate may include a first polyimide layer, a first barrier film layer, a second polyimide layer, and a second barrier film layer. The first transparent magnetic layer 305 may be embedded (or buried) within the substrate 115 having a multi-layered structure. For example, the first transparent magnetic layer 305 may be located between the first polyimide layer and the first barrier film, between the first barrier film and the second polyimide layer, or between the second polyimide layer and the second barrier film.

Embodiments may be applied to various display devices including an organic light emitting display device. For example, embodiments may be applied to vehicle-display device, a ship-display device, an aircraft-display device, portable communication devices, display devices for display or for information transfer, or a medical-display device.

By way of summation and review, a flexible OLED device may be capable of bending or folding the display device by including lower and upper substrates having flexible materials. For example, the lower substrate included in a display panel may be formed of a flexible substrate, and the upper substrate included in the display panel may have a thin film encapsulation structure. The flexible display device may further include upper members and protection films. The upper structures may be disposed in an upper surface of the display panel, and the protection films may be disposed in a lower surface of the display panel. To fix the upper structures, the display panel, and the protection films, adhesive films may be interposed therebetween. However, when the flexible display device is repeatedly bent or folded, the tensile and compressive forces may be repeatedly applied to the adhesive films, and a delamination phenomenon may occur, for example, due to a difference of the restoring force of each of the adhesive films.

Embodiments relate to flexible display devices. A display device according to example embodiments may include first and second transparent magnetic layers, and a display panel and an upper member that are disposed between the first and second transparent magnetic layers may be fixed without adhesive films. The display device may be repeatedly bent or folded, and the display device may not be delaminated.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a first transparent magnetic layer;
a display panel on the first transparent magnetic layer;
an upper member on the display panel, the upper member including at least one of a polarizer and a touch screen panel; and
a second transparent magnetic layer on the upper member, such that the display panel and the upper member are interposed between the first transparent magnetic layer and the second transparent magnetic layer, the second transparent magnetic layer being penetrated by light from the display panel.

2. The display device as claimed in claim 1, wherein an attractive force is applied between the first transparent magnetic layer and the second transparent magnetic layer.

3. The display device as claimed in claim 2, wherein the display panel and the upper member that are between the first and second transparent magnetic layers are fixed between the first and second transparent magnetic layers through the attractive force.

4. The display device as claimed in claim 1, wherein the first transparent magnetic layer and the second transparent magnetic layer include same materials.

5. The display device as claimed in claim 4, wherein the materials have a nanotube structure of one-dimensional carbon nitride having a cylindrical shape, and the nanotube structure of carbon nitride has armchair shapes and zigzag shapes.

6. The display device as claimed in claim 1, wherein the upper member includes the polarizer and the touch screen panel.

7. The display device as claimed in claim 6, wherein:
the polarizer is on the display panel, and
the touch screen panel is on the polarizer.

8. The display device as claimed in claim 7, further comprising:
a third transparent magnetic layer between the display panel and the polarizer.

9. The display device as claimed in claim 8, wherein:
an attractive force is applied between the first transparent magnetic layer and the third transparent magnetic layer, and is applied between third transparent magnetic layer and the second transparent magnetic layer, and
an attractive force is applied between the first transparent magnetic layer and the second transparent magnetic layer.

10. The display device as claimed in claim 9, wherein the display panel, the polarizer, and the touch screen panel that are between the first, second, and third transparent magnetic layers are fixed between the first, second, and third transparent magnetic layers through the attractive force.

11. The display device as claimed in claim 8, further comprising:
a fourth transparent magnetic layer between the polarizer and the touch screen panel.

12. The display device as claimed in claim 11, wherein an attractive force is applied between the first, second, third, and fourth transparent magnetic layers to each other, and the display panel, the polarizer, and the touch screen panel that are between the first, second, third, and fourth transparent magnetic layers are fixed between the first, second, third, and fourth transparent magnetic layers through the attractive force.

13. The display device as claimed in claim 12, wherein the first, second, third, and fourth transparent magnetic layers include same materials, and the materials have a nanotube structure of one-dimensional carbon nitride having a cylindrical shape.

14. The display device as claimed in claim 1, wherein the display panel includes:
  a substrate;
  a display structure on the substrate; and
  a thin film encapsulation structure on the display structure.

15. The display device as claimed in claim 14, wherein the display structure includes:
  a lower electrode on the substrate;
  a light emitting layer on the lower electrode, the light emitting layer emitting a light; and an upper electrode on the light emitting layer.

16. The display device as claimed in claim 15, wherein the second transparent magnetic layer has a mesh structure including a plurality of openings, and the light emitted from the light emitting layer travels through the openings, and
  wherein the openings overlap the light emitting layer.

17. The display device as claimed in claim 15, wherein the display panel further includes:
  a semiconductor element between the substrate and the display structure.

18. The display device as claimed in claim 17, wherein the semiconductor element includes:
  an active layer on the substrate;
  a gate electrode on the active layer; and
  source and drain electrodes on the gate electrode.

19. The display device as claimed in claim 18, further comprising:
  a gate insulation layer on the substrate, the gate insulation layer covering the active layer;
  an insulating interlayer on the gate insulation layer, the insulating interlayer covering the gate electrode;
  a planarization layer on the insulating interlayer, the planarization layer covering the source and drain electrodes; and
  a pixel defining layer on the planarization layer, the pixel defining layer exposing a portion of the lower electrode.

20. The display device as claimed in claim 15, wherein the thin film encapsulation structure includes:
  a first encapsulation layer on the upper electrode, the first encapsulation layer including inorganic materials;
  a second encapsulation layer on the first encapsulation layer, the second encapsulation layer including organic materials; and
  a third encapsulation layer on the second encapsulation layer, the third encapsulation layer including inorganic materials.

* * * * *